US009425609B2

(12) United States Patent
Wahlroos et al.

(10) Patent No.: US 9,425,609 B2
(45) Date of Patent: Aug. 23, 2016

(54) METHOD AND APPARATUS FOR DIFFERENTIAL PROTECTION OF AN ELECTRIC CONNECTION

(71) Applicant: ABB Technology AG, Zürich (CH)

(72) Inventors: Ari Wahlroos, Vaasa (FI); Janne Altonen, Toijala (FI)

(73) Assignee: ABB Technology AG, Zurich (CH)

( * ) Notice: Subject to any disclaimer, the term of this patent is extended or adjusted under 35 U.S.C. 154(b) by 830 days.

(21) Appl. No.: 13/648,813

(22) Filed: Oct. 10, 2012

(65) Prior Publication Data

US 2013/0035882 A1  Feb. 7, 2013

Related U.S. Application Data

(63) Continuation of application No. PCT/EP2011/054304, filed on Mar. 22, 2011.

(30) Foreign Application Priority Data

Apr. 12, 2010 (EP) ..................... 10159610

(51) Int. Cl.
*H02H 3/28* (2006.01)
*G01R 31/08* (2006.01)
(Continued)

(52) U.S. Cl.
CPC ............. *H02H 3/286* (2013.01); *G01R 31/086* (2013.01); *G01R 31/3275* (2013.01); *H02H 3/385* (2013.01); *H02H 7/045* (2013.01)

(58) Field of Classification Search
CPC ....... H02H 3/286; H02H 3/385; H02H 7/045; G01R 31/086; G01R 31/3275; G01R 31/025
See application file for complete search history.

(56) References Cited

U.S. PATENT DOCUMENTS 6,442,010 B1 * 8/2002 Kasztenny et al. ............. 361/63
2004/0021995 A1  2/2004 Roberts et al.
(Continued)

FOREIGN PATENT DOCUMENTS

CN   1902798 A   1/2007
JP   2002-186165 A   6/2002

OTHER PUBLICATIONS

Chinese Office Action (Notification of the First Office Action) dated Feb. 8, 2014, issued in corresponding Chinese Application No. 201180018396.7 and an English translation thereof. (13 pgs.).

(Continued)

*Primary Examiner* — Alexander Satanovsky
*Assistant Examiner* — John Kuan
(74) *Attorney, Agent, or Firm* — Taft Stettinius & Hollister LLP

(57) ABSTRACT

A method and apparatus are provided for differential protection of a three phase electric connection of an electric system. The apparatus includes means for determining a value of an operate quantity, which operate quantity is based on a difference between current quantities at a first point and a second point of the electric connection, and means for detecting a fault in the electric connection between the first point and the second point if the value of the operate quantity exceeds a value of a predetermined threshold quantity. The operate quantity is based on a difference of residual currents at the first point and the second point, or a quantity indicative thereof, and a coefficient indicative of an angle between a residual voltage of the electric connection and the difference of residual currents at the first point and the second point.

12 Claims, 6 Drawing Sheets

(51) Int. Cl.
*G01R 31/327* (2006.01)
*H02H 3/38* (2006.01)
*H02H 7/045* (2006.01)

(56) References Cited

U.S. PATENT DOCUMENTS

2007/0085549 A1    4/2007  Fischer
2010/0254056 A1*  10/2010  Narendra et al. ............... 361/87
2012/0182657 A1*   7/2012  Narendra et al. ............... 361/87

OTHER PUBLICATIONS

Search Report dated Aug. 25, 2010, issued in corresponding European Patent Application No. 10159610.4 (6 pages).

"Line Differential Protection with Distance Protection 75D52/53, V 4.60, Manual", 7SD5 Manual, C53000-G1176-C169-3, Siemens AG, 2007, pp. 1-752.

"Application Manual Line Differential Protection IED RED 670", ABB AB Substation Automation Products, Document ID: 1MRK505135-UEN, Revision: D, IED product version: 1.B, Dec. 2007, pp. 1-494.

International Search Report (PCT/ISA/210) issued on Apr. 19, 2011, by the European Patent Office as the International Searching Authority for International Application No. PCT/EP2011/054304.

* cited by examiner

= LINE DIFFERENTIAL PROTECTION

Measuring point A    Fault point    Measuring point B

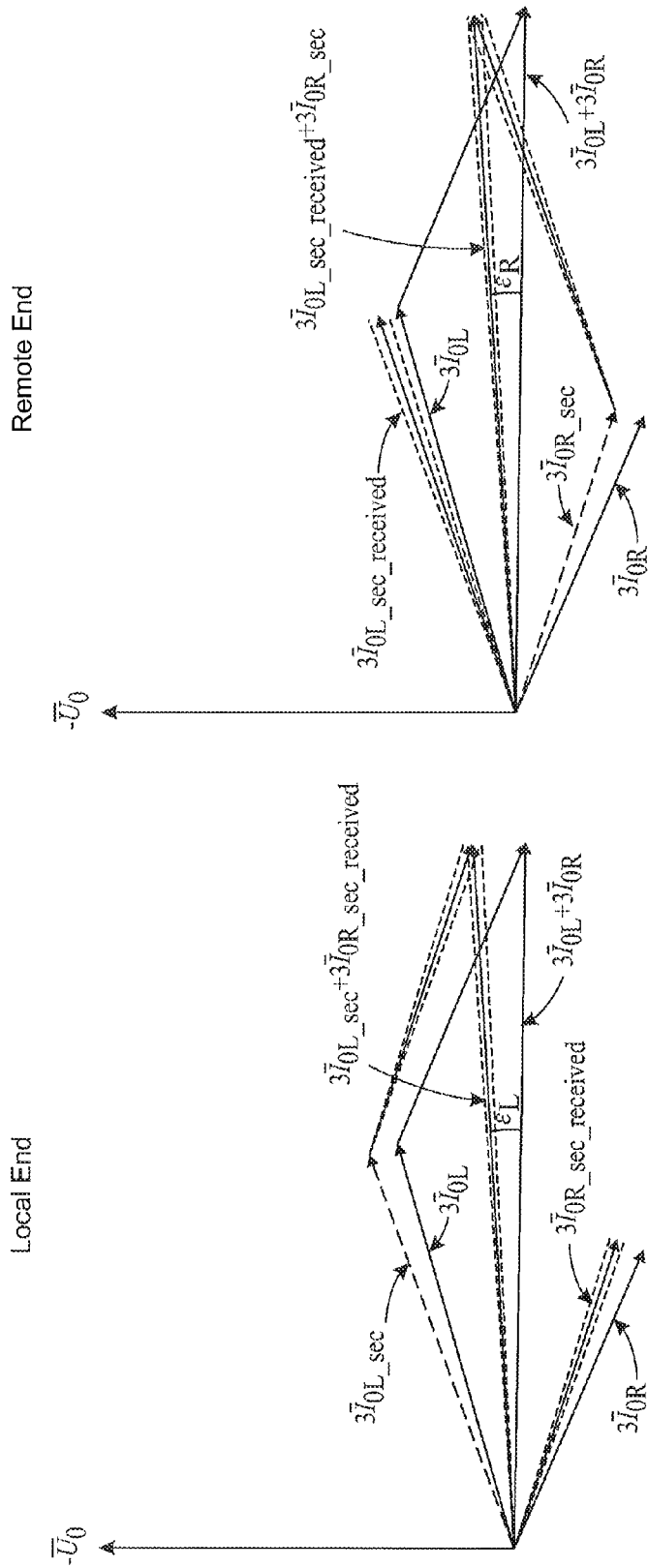

METHOD AND APPARATUS FOR DIFFERENTIAL PROTECTION OF AN ELECTRIC CONNECTION

RELATED APPLICATION

This application claims priority under 35 U.S.C. §119 to European Patent Application No. 10159610.4 filed in Europe on Apr. 4, 2010, the entire content of which is hereby incorporated by reference in its entirety.

FIELD

The present disclosure relates to differential protection of an electric connection against earth faults.

BACKGROUND INFORMATION

In principal, differential current protection compares measured currents from the ends of an electric line regarding both the magnitude and the phase angle. In operation, there must be an interconnecting channel between the line end relays, over which the interchange of current information is transferred. According to Kirchhoff's law, when the vector sum of these currents differs from zero, it indicates a fault in the protected line. Such differential current protection is the simplest form of line protection requiring only few settings to be entered regarding the characteristic of the protected line.

It is known that line differential current protection has been implemented according to the phase segregated or the combined sequence principle. In the phase segregated scheme, differential current protective functions are implemented on per phase-current basis. The phase current differential computations determine whether a fault has occurred and identify which phase or phases is/are involved in the fault. In the combined sequence scheme, in order to reduce the communication capacity requirements while maintaining adequate operation speed and reliability of operation, only one single signal instead of all three phase currents are interchanged between the line ends. This signal is a proper combination of the line positive-sequence, negative-sequence and zero-sequence currents. The differential current computations are then based on this combined sequence current signal.

The basic principle of the phase segregated scheme is that the differential (operate) quantity in the current differential function is the magnitude of the phasor summation of the local and remote phase currents. Thus, the operate quantity is equal to the total fault currents for internal faults and equal to zero (neglecting line distributed capacitance charging currents) for external faults. For phase A it can be written:

$$I_{OPphA} = |\bar{I}_{LphA} + \bar{I}_{RphA}| \quad (eq01)$$

The scheme must be restrained so that certain level of apparent operate current resulting from, for example, CT and other measuring errors that are proportional to the magnitude of the measured phase currents can be allowed without the risk of false operation. The restraint (stabilizing) current for phase A can be calculated, for example, as:

$$I_{RESphA} = \frac{|\bar{I}_{LphA}| + |\bar{I}_{RphA}|}{2} \quad (eq02)$$

where $\bar{I}_{LphA}$ is the local end phasor representing phase current, A and $\bar{I}_{RphA}$ is the remote end phasor representing phase current A Equations 01 and 02 assume positive current flow from the busbar towards the line in both line ends. Similar equations apply for phases B and C.

The scheme can also be based on the combined sequence current, which is a weighted sum of phase A symmetrical component currents. Let $\bar{I}_T$ represent this combined current, and let $C_1$, $C_2$ and $C_0$ represent the weighting coefficients for positive-, negative-, and zero-sequence components, then $\bar{I}_T$ can be described as:

$$\bar{I}_T = C_1\bar{I}_1 + C_2\bar{I}_2 + C_0\bar{I}_0 \quad (eq03)$$

where $\bar{I}_1$, $\bar{I}_2$ and $\bar{I}_0$ represent phase A positive-sequence, negative-sequence, and zero-sequence currents, respectively.

For the combined sequence scheme, the operate and restraint currents can be written in a way similar to the above:

$$I_{T_{OP}} = |\bar{I}_{T_L} + \bar{I}_{T_R}| \quad (eq04)$$

$$I_{T_{RES}} = \frac{|\bar{I}_{T_L}| + |\bar{I}_{T_R}|}{2} \quad (eq05)$$

where $\bar{I}_{TL}$ is the local end phasor representing the combined sequence current, and $\bar{I}_{TR}$ is the remote end phasor representing the combined sequence current.

The operating principle of the traditional solutions in the simplest form is given by the equation:

$$I_{OP} > k \cdot I_{RES} + I_B \quad (eq06)$$

where $I_{OP}$ is the calculated operate current, $I_{RES}$ is the calculated restraint current, k is the characteristic slope setting, and $I_B$ is the basic start current threshold setting.

The operating criterion states that the higher the restraint current is, the higher operate current threshold is required to operate the relay. The correspondence between these two current quantities is given by the slope setting k.

In general, the limit of sensitivity of the traditional schemes is basically dictated by the amplitude of the charging current of the protected line. This charging current is due to the distributed capacitance (phase-to-phase and phase-to-earth capacitance) of the protected line and is seen as apparent differential current by the relay. As a general rule, the setting of the differential current protection is such that it overrides the effect of the charging current. To mitigate this problem, some manufacturers have introduced a so-called charging current compensation function to somewhat increase the sensitivity of the protection. This feature can be used with phase segregated schemes and it is known by various relay manufacturers. Examples are given in documents: Siemens A G, "SIPROTEC, Line Differential Protection with Distance Protection 7SD52/53, V 4.60, Manual", and ABB AB Substation Automation Products, SE-721 59 Västerås, Sweden, "Application manual Line differential protection IED RED 670", December 2007. The main purpose of the charging current compensation function is to enable adequately sensitive differential current protection of long transmission lines and cables in low-impedance or solidly earthed networks, where otherwise the magnitude of the charging current would require increasing of the basic start current threshold setting of the traditional schemes too much. The magnitude of the charging current is directly proportional to the system voltage level and to the magnitude of the distributed capacitance of the protected line.

In the combined sequence schemes, the sensitivity is additionally affected by the choice of the weighting coefficients. Increasing of weighting coefficient $C_2$ (eq03) can increase the earth fault sensitivity and reduce the sensitivity difference between three-phase faults and earth faults in cases where the earth fault current is lower than the three-phase fault current. In order to increase the sensitivity of earth faults and at the same time to keep the sensitivity of phase faults unaffected, a non-zero weighting coefficient $C_0$ (eq03) can be used.

As a general rule, the maximum sensitivity that can be achieved by the above schemes depends on the setting of the basic start current threshold level as follows:

No charging current compensation feature in use:
$I_B \geq 2.5 * I_{CHARGE}$
Charging current compensation feature in use:
$I_B \geq 1.0 * I_{CHARGE}$
where $I_{CHARGE}$ is the corresponding charge current component of the protected line calculated according to its positive-, (negative-) or zero-sequence capacitance depending on the applied scheme.

The fundamental problem of the above schemes when considering their application in unearthed and compensated networks is that in order to ensure adequate sensitivity, the basic start current threshold setting level would have to be set well below the charging current of the protected line, and this cannot be done with the above schemes. It can be said that for that reason these schemes are not able to detect earth faults, at least not when fault resistance becomes involved in the fault.

Therefore, the sensitivity of such traditional solutions is typically adequate only against short circuit faults and against earth faults in low-impedance and solidly earthed networks, where the magnitude of earth fault current is typically always higher than 25% of the three-phase short circuit current. Considering earth faults in high-impedance earthed and unearthed networks, the magnitude of earth fault current can be as low as a few amperes. It is therefore evident that the traditional solutions cannot be used for earth fault protection in such networks. However, selective earth fault protection is also required for lines where line differential current protection is applied against short circuits. It would therefore be highly valuable to have a dedicated differential current protection function with high sensitivity against earth faults.

FIG. 1 shows known network arrangements where line differential current protection is applied as the main protection. As the network arrangements of FIG. 1 are highly meshed and may also contain distributed generation, the application of the line differential current protection is very well justified, but the fundamental problem is how to take care of the dedicated earth fault protection of these lines such that the operation is selective, sensitive and fast enough despite the changing network configurations due to daily operation.

JP 2002186165 describes a solution to provide a differential current relay which is fitted to an unearthed system with meshed distribution lines and which does not need synchronization among data collected at individual terminals. According to this solution, by determining the sign of the sum of imaginary parts $\text{Im}[\bar{I}_{0A}\bar{V}_{0A}^*]$, i.e. of the product of the zero-sequence current and the complex conjugate of the zero-sequence voltage, and $\text{Im}[\bar{I}_{0B}\bar{V}_{0B}^*]$ based on measurements from line ends A and B, respectively, it can be judged whether an earth fault occurs in the section between the differential current relay A and the neighboring differential relay B. A drawback of the described solution is that it can only be applied in unearthed networks.

SUMMARY

An exemplary embodiment of the present disclosure provides a method for differential protection of a three phase electric connection of an electric system. The exemplary method includes determining a value of an operate quantity, where the operate quantity is based on a difference between current quantities at a first point and a second point of the electric connection. The exemplary embodiment also includes detecting a fault in the electric connection between the first point and the second point if the value of the operate quantity exceeds a value of a predetermined threshold quantity, wherein the operate quantity $I_{OP}$ is defined by the following equation:

$$I_{OP} = |d3\bar{I}_0| \cdot \text{gain} = |3\bar{I}_{0L} + 3\bar{I}_{0R}| \cdot \text{gain},$$

where
$d3\bar{I}_0$ = residual differential current phasor,
$3\bar{I}_{0L}$ = residual current phasor at the first point such that a positive current flow is towards the second point,
$3\bar{I}_{0R}$ = residual current phasor at the second point such that a positive current flow is towards the first point, and $$\text{gain} = \cos(\text{angle}(-\bar{U}_0/d3\bar{I}_0) - \phi_b),$$

where
$\phi_b$ = characteristic angle setting, and
$\bar{U}_0$ = residual voltage phasor of the electric connection.

An exemplary embodiment of the present disclosure provides a non-transitory computer-readable recording medium having a computer program recorded thereon that causes a processor of a computer processing device to carry out operations for differential protection of a three phase electric connection of an electric system. The operations include determining a value of an operate quantity, where the operate quantity being based on a difference between current quantities at a first point and a second point of the electric connection. In addition, the operations include detecting a fault in the electric connection between the first point and the second point if the value of the operate quantity exceeds a value of a predetermined threshold quantity, wherein the operate quantity $I_{OP}$ is defined by the following equation:

$$I_{OP} = |d3\bar{I}_0| \cdot \text{gain} = |3\bar{I}_{0L} + 3\bar{I}_{0R}| \cdot \text{gain},$$

where
$d3\bar{I}_0$ = residual differential current phasor,
$3\bar{I}_{0L}$ = residual current phasor at the first point such that a positive current flow is towards the second point,
$3\bar{I}_{0R}$ = residual current phasor at the second point such that a positive current flow is towards the first point, and $$\text{gain} = \cos(\text{angle}(-\bar{U}_0/d3\bar{I}_0) - \phi_b),$$

where
$\phi_b$ = characteristic angle setting, and
$\bar{U}_0$ = residual voltage phasor of the electric connection.

An exemplary embodiment of the present disclosure provides an apparatus for differential protection of a three phase electric connection of an electric system. The exemplary apparatus includes means for determining a value of an operate quantity, where the operate quantity being based on a difference between current quantities at a first point and a second point of the electric connection. In addition, the exemplary apparatus includes means for detecting a fault in the electric connection between the first point and the second point if the value of the operate quantity exceeds a value of a predetermined threshold quantity, wherein the operate quantity $I_{OP}$ is defined by the following equation:

$$I_{OP} = |d3\bar{I}_0| \cdot \text{gain} = |3\bar{I}_{0L} + 3\bar{I}_{0R}| \cdot \text{gain},$$

where
$d3\bar{I}_0$ = residual differential current phasor,
$3\bar{I}_{0L}$ = residual current phasor at the first point such that a positive current flow is towards the second point, $3\overline{I}_{OR}$=residual current phasor at the second point such that a positive current flow is towards the first point, and $$\text{gain}=\cos(\text{angle}(-\overline{U}_0/d3\overline{I}_0)-\phi_b),$$

where
$\phi_b$=characteristic angle setting, and
$\overline{U}_0$=residual voltage phasor of the electric connection.

BRIEF DESCRIPTION OF THE DRAWINGS

In the following, the disclosure will be described in greater detail by means of exemplary embodiments with reference to the accompanying drawings, in which:

FIG. 9 shows an example of formation and effect of phase angle errors on the measured residual differential current in local and remote connection ends.

DETAILED DESCRIPTION

Exemplary embodiments of the present disclosure provide a method and an apparatus for implementing the method so as to overcome the above problem or at least to alleviate the problem. Exemplary embodiments of the present disclosure provide a method, an apparatus, and non-transitory computer-readable recording medium having a computer program recorded thereon that causes a processor of a computer processing device to carry out features of the exemplary method and/or apparatus.

Exemplary embodiments of the present disclosure are based on the idea of using an operate quantity based on a difference of residual currents at the first point and the second point, or a quantity indicative thereof, and a coefficient indicative of an angle between a residual voltage of the electric connection and the difference of residual currents at the first point and the second point.

In accordance with an exemplary embodiment of the present disclosure, the zero-sequence charging current of the protected line does not limit the sensitivity of the protection especially in unearthed and in compensated networks. Therefore, high sensitivity can be obtained, for example, earth faults with fault resistance can be detected. The solution of the present disclosure can be used in unearthed and compensated networks. It can also be used in low impedance and solidly earthed networks to improve sensitivity in detecting earth faults.

The application of the present disclosure is not limited to any specific system, but it can be used in connection with various three-phase electric systems to detect a phase-to-earth fault in a three-phase electric connection of an electric system. The electric connection may be an electric line such as a feeder, for example, and it may be an overhead-line or a cable or a combination of both. The electric connection may also be a part of an electric line or include several electric lines connected together. The electric system in which the present disclosure is implemented can be an electric transmission or distribution network or a component thereof, for example, and may include several feeders or sections. Moreover, the use of the present disclosure is not limited to systems employing 50 Hz or 60 Hz fundamental frequencies or to any specific voltage level. The present disclosure may be used alone or as a complementary function for the traditional line differential current protection functions.

Figure 1:
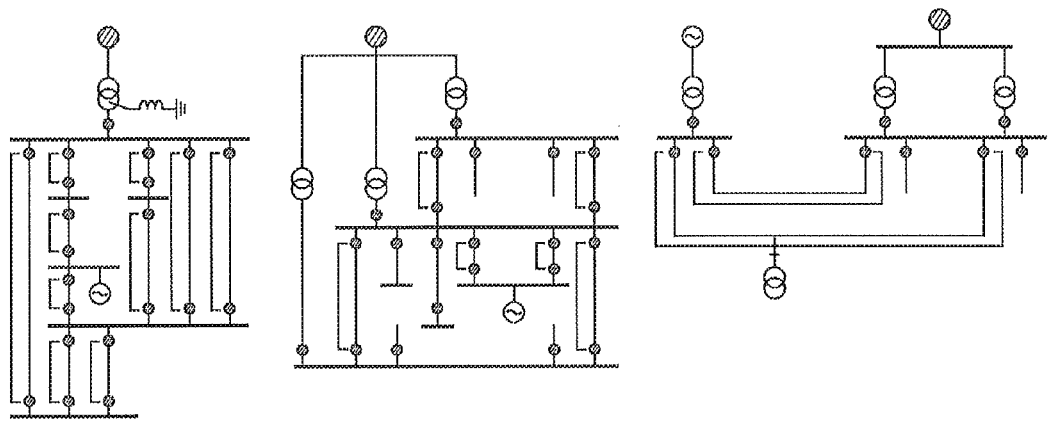
FIG. 1 shows examples of network arrangements with line differential current protection.
Figure 2:
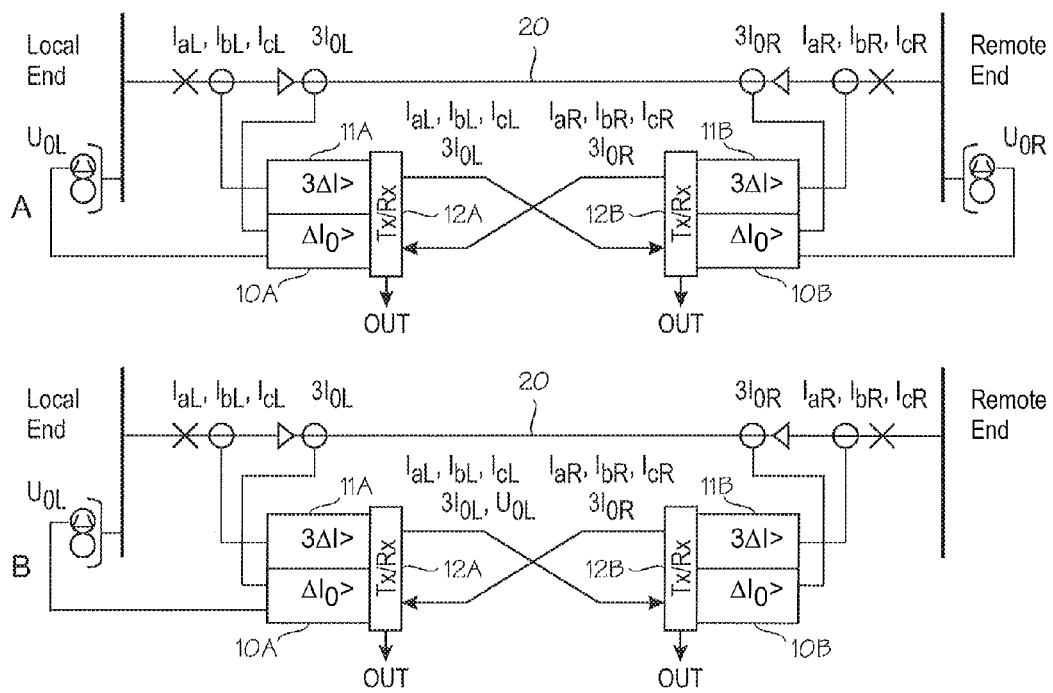
FIG. 2 shows examples of arrangements according to exemplary embodiments of the present disclosure.

FIG. 2 shows arrangements according to some exemplary embodiments of the present disclosure. Alternative A shows an arrangement in which an electric connection 20 is protected by differential protection units 10A+11A+12A and 10B+11B+12B at both ends. The differential protection units in this example each include a standard differential protection unit (3ΔI>) 11A and 11B, a directional residual differential current protection unit (ΔI₀>) 10A and 10B, and a transmitter-receiver unit (Tx/Rx) 12A and 12B. These three units 10A/10B, 11A/11B and 12A/12B may be implemented as one unit or device or as a system including more than one separate unit or device. It is also possible to combine at least some units of different connection ends into the same physical unit or device. The ends of the electric connection 20 have been identified as 'Local End' and 'Remote End'. For the first differential protection unit 10A, 11A, 12A, the 'Local End' is the local end and the 'Remote End' is the remote end. However, for the second differential protection unit 10B, 11B, 12B, the connection end marked 'Local End' is the remote end, and the connection end marked 'Remote End' is the local end. At each connection end, the residual current $3\overline{I}_{OL}$ and $3\overline{I}_{OR}$, the residual voltage $\overline{U}_{OL}$ and $\overline{U}_{OR}$ and the three phase currents $\overline{I}_{aL}, \overline{I}_{bL}, \overline{I}_{cL}$ and $\overline{I}_{aR}, \overline{I}_{bR}, \overline{I}_{cR}$ are preferably determined by the differential protection unit or units 10A and/or 11A and 10B and/or 11B. It may be assumed that a positive current flow is from the connection end towards the connection 20 at both remote and local ends. The current values may then be interchanged between the differential protection units of the different ends by the transmitter-receiver units 12A and 12B. The residual voltage may be based on local measurement if suitable measurement transformers are available in both connection ends. Alternatively, the residual voltage measured in one end can be transmitted to the other connection end using the same communication media/interface as is used for interchanging the current values. When the solution according to various embodiments of the present disclosure is implemented as a complementary function for the standard differential current protection scheme of the connection, as shown in the examples in FIG. 2, requiring already the transfer of the phase current phasor information between the connection ends, the same already existing communication media/interface can easily be used/extended for the needs of this new function. To maximize the sensitivity of the scheme, cable current transformers (ring core current transformers) are recommended for the measurement of the residual current. However, the sum connection of phase current transformers or numerically calculated residual current from phase currents measured by phase current transformers or Rogowski sensors, for example, can be used as well. In addition to the current quantities, the residual voltage of the system is needed. The residual voltage can be measured from an open delta winding of the voltage transformer, as shown, or it can be calculated numerically from phase-to-earth voltages measured by voltage transformers or resistive voltage dividers, for example. The residual voltage may be determined individually by the differential protection units of different ends at different points, as shown in alternative A of FIG. 2. Alternatively, the residual voltage may be determined by only one of the two differential protection units and then transferred to the other differential protection unit, as shown in alternative B of FIG. 2 which otherwise corresponds to alternative A of FIG. 2.

According to an exemplary embodiment, the operation of the directional residual differential current protection unit 10A, 10B is as follows. First, a value of an operate quantity is determined. The operate quantity may be based on a difference of residual currents at the local end (first point) and the remote end (second point), or a quantity indicative thereof, and a coefficient indicative of an angle between a residual voltage of the electric connection 20 and the difference of residual currents at the local end and the remote end. According to an exemplary embodiment, the operate quantity $I_{OP}$ is defined by the following equation:

$$I_{OP}=|d3\bar{I}_0|\cdot gain=|3\bar{I}_{0L}+3\bar{I}_{0R}|\cdot gain \quad (eq07)$$

where
$d3\bar{I}_0$ is the residual differential current phasor,
$3\bar{I}_{0L}$ is the local end residual current phasor such that a positive current flow is towards the remote end, and
$3\bar{I}_{0R}$ is the remote end residual current phasor such that a positive current flow is towards the local end.

If the residual voltage is measured from both ends of the connection, the gain is for the local end:

$$gainL=\cos(angle(-\bar{U}_{0L}/d3\bar{I}_0)-\phi_b), \quad (eq08a)$$

and for the remote end:

$$gainR=\cos(angle(-\bar{U}_{0R}/d3\bar{I}_0)-\phi_b). \quad (eq08b)$$

where
$\phi_b$ is the characteristic angle setting (base angle),
$\bar{U}_{0L}$ is the local end residual voltage phasor and
$\bar{U}_{0R}$ is the local end residual voltage phasor.

Typically the polarizing quantity is the residual voltage ($-\bar{U}_0$), equations 08a and 08b, but alternatively the neutral current measured from the connection between the neutral point of the incoming transformer and earth can be used instead.

Alternatively, the polarizing quantity can be measured at one end of the connection 20 only and then transmitted to the other end. In that case the gain is calculated using the same equation 08a or 08b at both ends of the connection. Thus, if the residual voltage is measured at only one point of the connection, the gain is:

$$gain=\cos(angle(-\bar{U}_0/d3\bar{I}_0)-\phi_b), \quad (eq08c)$$

where
$\bar{U}_0$ is the residual voltage phasor

Figure 3:
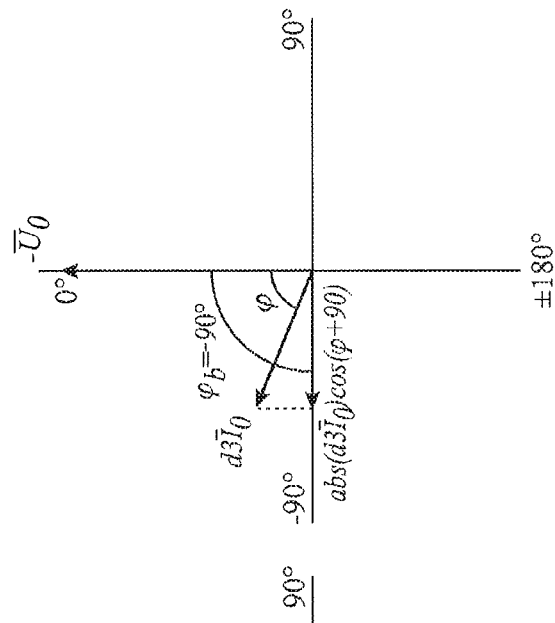
FIG. 3 shows examples of phasor diagrams according to exemplary embodiments of the present disclosure.
Figure 3:
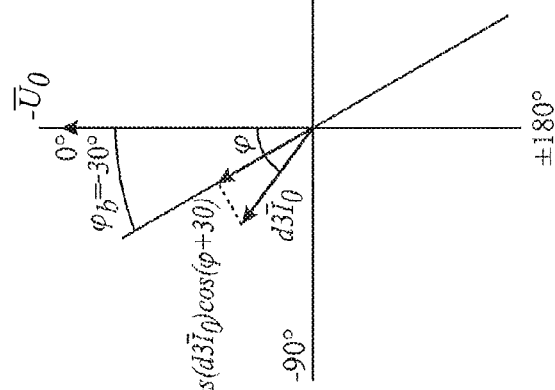
Figure 3:
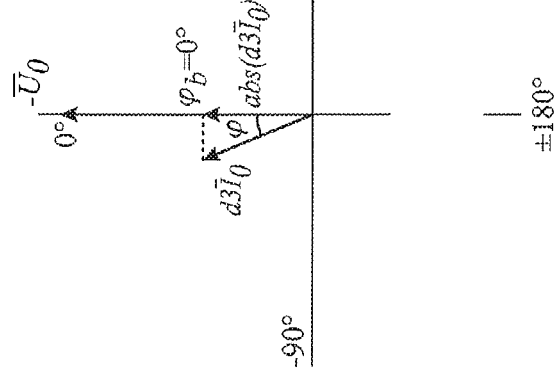

The choice for the characteristic angle setting, $\phi_b$, depends on the earthing arrangement of the network. In accordance with an exemplary embodiment, the characteristic angle is selected such that the value of the gain during a fault within the protected connection is as close to unity as possible, which results in best possible sensitivity of the protection. In a similar manner, the value of the gain during a fault outside the protected connection should be as close to zero, or even negative, which results in best possible stability of the protection. FIG. 3 shows the calculation principle of the operate quantity $I_{OP}=abs(d3\bar{I}_0)\cdot gain$ with the residual voltage as the polarizing quantity and with three different values of the characteristic angle setting $\phi_b$: $\phi_b=[0\ -30\ -90]$ degrees corresponding to alternatives a, b and c. According to an exemplary embodiment, the characteristic angle setting may be zero degrees for a compensated electric system, $-30$ degrees for a high-resistance earthed electric system and $-90$ degrees for an unearthed electric system. According to an exemplary embodiment, the characteristic angle setting is freely settable between $-90$ and $90$ degrees. The characteristic angle setting may be set based on an angle between the residual voltage and the residual current during an earth fault inside the electric connection.

Figure 4:
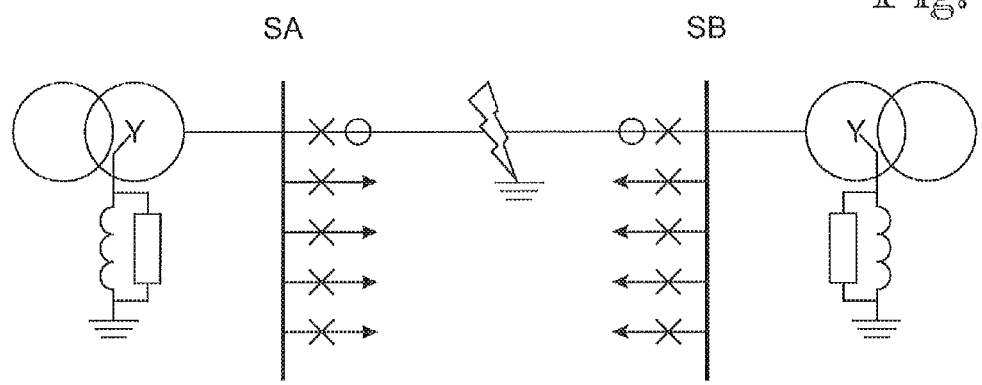
FIG. 4 shows an example of a circuit diagram for representing an earth fault in a connection between stations A and B according to an exemplary embodiment of the present disclosure.
Figure 5:
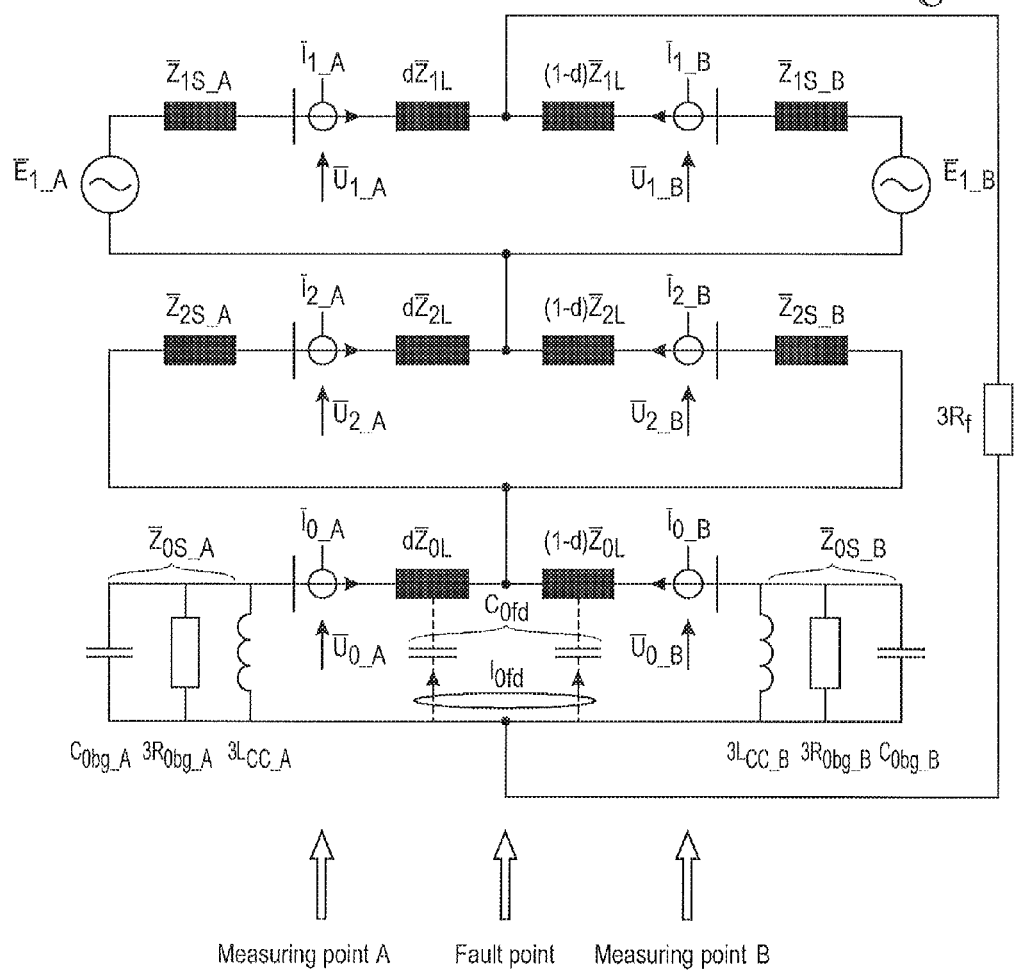
FIG. 5 shows an example of a sequence component equivalent circuit diagram for calculating earth fault quantities in case of a fault in a feeder between stations A and B according to an exemplary embodiment of the present disclosure.

The characteristic angle setting can also be set according to the determined angle of the total zero-sequence impedance of the sources seen from the fault point, which can be calculated using general network calculus. FIG. 4 and FIG. 5 demonstrate this for a single feeder between stations SA (Measuring point A) and SB (Measuring point B) during inside fault condition. Notations used in FIG. 5:

$\bar{I}_{1\_A/B}$=positive-sequence current measured from the protected feeder, local/remote end
$\bar{I}_{2\_A/B}$=negative-sequence current measured from the protected feeder, local/remote end
$\bar{I}_{0\_A/B}$=zero-sequence current measured from the protected feeder, local/remote end
$\bar{I}_{0fd}$=zero-sequence current of the protected feeder
$\bar{U}_{1\_A/B}$=positive-sequence voltage of the network, local/remote end
$\bar{U}_{2\_A/B}$=negative-sequence voltage of the network, local/remote end
$\bar{U}_{0\_A/B}$=zero-sequence voltage of the network, local/remote end
$R_f$=fault resistance
$\bar{Z}_{1S\_A/B}$=positive-sequence source impedance, local/remote end
$\bar{Z}_{2S\_A/B}$=negative-sequence source impedance, local/remote end
$\bar{Z}_{0S\_A/B}$=zero-sequence source impedance, local/remote end
$\bar{Z}_{1L}$=positive-sequence line impedance
$\bar{Z}_{2L}$=negative-sequence line impedance
$\bar{Z}_{0L}$=zero-sequence line impedance
d=fault distance in p.u. from local end
$C_{0bg\_A/B}$=zero-sequence capacitance of the background network, local/remote end
$C_{0fd}$=zero-sequence capacitance of the protected feeder
$L_{CC\_A/B}$=inductance of the compensation coil, local/remote end
$R_{0bg\_A/B}$=resistance corresponding to losses of the background network, and the parallel resistor of the compensation coil, local/remote
$\bar{E}_{1\_A/B}$=source voltage, phase L1, local/remote end As, during an internal fault, the residual current measurement in both feeder ends sees only the current supplied from the corresponding background network, and when neglecting the series impedances, it can be seen from FIG. 5 that $$-\bar{U}_{0\_A}=-\bar{U}_{0\_B}=(3\bar{I}_{0\_A}+3\bar{I}_{0\_B})\left(\frac{1}{\frac{1}{\bar{Z}_{0S\_A}}+\frac{1}{\bar{Z}_{0S\_B}}}\right) \quad (eq09)$$

and

-continued $$\text{angle}\left(\frac{-\overline{U}_{0\_A}}{3\overline{I}_{0\_A} + 3\overline{I}_{0\_B}}\right) = \text{angle}\left(\frac{-\overline{U}_{0\_B}}{3\overline{I}_{0\_A} + 3\overline{I}_{0\_B}}\right) = \text{angle}\left(\frac{N1}{(D1+D2) - j(D3+D4-D5-D6)}\right) \quad (\text{eq10})$$

where $N1 = \omega L_{CC\_A} L_{CC\_B} R_{0bg\_A} R_{0bg\_B}$ $D1 = \omega L_{CC\_A} L_{CC\_B} R_{0bg\_B}$ $D2 = \omega L_{CC\_A} L_{CC\_B} R_{0bg\_A}$ $D3 = L_{CC\_B} R_{0bg\_A} R_{0bg\_B}$ $D4 = L_{CC\_A} R_{0bg\_A} R_{0bg\_B}$ $D5 = 3\omega^2 C_{0bg\_A} L_{CC\_A} L_{CC\_B} R_{0bg\_B} R_{0bg\_A}$ $D6 = 3\omega^2 C_{0bg\_B} L_{CC\_A} L_{CC\_B} R_{0bg\_B} R_{0bg\_A}$ Using eq10 with the following example network parameters, the corresponding characteristic angle setting can be calculated:

Undercompensated network:

$E_1 = 20/\text{sqrt}(3)$ kV $3I_{0bg\_A} = 100$ A $3I_{0bg\_B} = 20$ A $3I_{0fd} = 10$ A $3I_{Lcc\_A} = 110$ A (degree of compensation (110 A/130 A)*100%=85%)

$3I_{Lcc\_B} = 0$ A (no coil in remote end S/S)

$3I_{ORbgA} = 0.025 * 3I_{0bg\_A} + 10$ A $= 12.5$ A $3I_{ORbgB} = 0.025 * 3I_{0bg\_B} = 0.5$ A

→$L_{cc\_A} = 0.33$ H, $C_{0bg\_A} = 9.19$ □F, $R_{0bg\_A} = 1.13$ k□

→$L_{cc\_B} = 0$, $C_{0bg\_B} = 1.84$ □F, $R_{0bg\_B} = 231$ k□

→$\phi_b = \text{angle}(-\overline{U}_{0\_A}/(3\overline{I}_{0\_A} + 3\overline{I}_{0\_B})) \approx 44.2°$ Overcompensated network:

$E_1 = 20/\text{sqrt}(3)$ kV $3I_{0bg\_A} = 70$ A $3I_{0bg\_B} = 20$ A $3I_{0fd} = 10$ A $3I_{Lcc\_A} = 110$ A (degree of compensation (110 A/100 A)*100%=110%)

$3I_{Lcc\_B} = 0$ A (no coil in remote end S/S)

$3I_{ORbgA} = 0.025 * 3I_{0bg\_A} + 10$ A $= 12.0$ A $3I_{ORbgB} = 0.025 * 3I_{0bg\_B} = 0.5$ A

→$L_{cc\_A} = 0.33$ H, $C_{0bg\_A} = 6.43$ □F, $R_{0bg\_A} = 1.13$ k□

→$L_{cc\_B} = 0$, $C_{0bg\_B} = 1.84$ □F, $R_{0bg\_B} = 231$ k□

→$\phi_b = \text{angle}(-\overline{U}_{0\_A}/(3\overline{I}_{0\_A} + 3\overline{I}_{0\_B})) \approx 62.9°$ Conclusion: In this example the angle between the residual voltage and the residual differential current varies between −44 and 63 degrees depending on the compensation degree, so the characteristic angle can be set to zero degrees.

A change in the earthing arrangement of the electric system (e.g. from compensated to unearthed and vice versa) typically results in a need to change the characteristic angle setting in both protection units 10A and 10B of the connection 20. This can be done in a way similar to the traditional directional earth fault protection relays, e.g. by a binary input, and this information can be transferred to the local/remote end by the communication channel between the connection ends.

After the operate quantity has been determined, a fault is detected in the electric connection between the first point and the second point if the value of the operate quantity exceeds the value of a predetermined threshold quantity.

According to an exemplary embodiment, the scheme is restrained due to current transformer and other measurement errors related to the implementation and hardware. Especially with high through-fault currents, apparent residual differential current may arise, e.g. during three-phase fault or a two-phase-to-earth fault. Also in case of parallel lines unequal distribution of load current between the phases may generate apparent residual currents in each connection end despite the measurement method of the residual current. According to an exemplary embodiment, a restraint current $I_{RES}$ may be calculated based on phase current magnitudes in each connection end as follows:

$$I_{RES} = \frac{\frac{|\overline{I}_{aL}| + |\overline{I}_{aR}|}{2} + \frac{|\overline{I}_{bL}| + |\overline{I}_{bR}|}{2} + \frac{|\overline{I}_{cL}| + |\overline{I}_{cR}|}{2}}{3} \quad (\text{eq11})$$

where $\overline{I}_{aL}, \overline{I}_{bL}, \overline{I}_{cL}$ are the phase current phasors of the electric connection at the first point, and $\overline{I}_{aR}, \overline{I}_{bR}, \overline{I}_{cR}$ are the phase current phasors of the electric connection at the second point.

According to an exemplary embodiment, the predetermined threshold quantity is then:

$P_0$ when $I_{RES} \leq I_{KNEE\_0}$, and $P_0 + S_0 * (I_{RES} - I_{KNEE\_0})$ when $I_{RES} > I_{KNEE\_0}$, where $P_0, S_0, I_{KNEE\_0}$ = predetermined parameters.

Parameter $P_0$ defines the basic sensitivity of the protection, and it may be set on the basis of the real component or the reactive component of the residual current measured from the ends of the connection 20.

In case of an internal fault, the residual differential current as a function of fault resistance, $R_f$, can be calculated using general network calculus. This is the basic method for selecting the setting $P_0$. For example, for a single line between stations A and B (FIGS. 4 and 5), eq12 and notations given in eq10 are valid.

$$d3\overline{I}_0 = \overline{E}_1 \frac{(N1+N2) - j(N3+N4-N5-N6)}{(D1+D2+D3) - j(D4+D5-D6-D7-D8)} \quad (\text{eq12})$$

where $N1 = \omega L_{CC\_A} L_{CC\_B} R_{0bg\_A}$ $N2 = \omega L_{CC\_A} L_{CC\_B} R_{0bg\_B}$ $N3 = L_{CC\_A} R_{0bg\_A} R_{0bg\_B}$ $N4 = L_{CC\_B} R_{0bg\_A} R_{0bg\_B}$ $N5 = 3\omega^2 C_{0\_bgA} L_{CC\_A} L_{CC\_B} R_{0bg\_A} R_{0bg\_B}$ -continued $$N6 = 3\omega^2 C_{0\_bgB} L_{CC\_A} L_{CC\_B} R_{0bg\_A} R_{0bg\_B}$$

$$D1 = R_f \omega L_{CC\_A} L_{CC\_B} R_{0bg\_A}$$

$$D2 = R_f \omega L_{CC\_A} L_{CC\_B} R_{0bg\_B}$$

$$D3 = \omega L_{CC\_A} L_{CC\_B} R_{0bg\_A} R_{0bg\_B}$$

$$D4 = R_f L_{CC\_A} R_{0bg\_A} R_{0bg\_B}$$

$$D5 = R_f L_{CC\_B} R_{0bg\_A} R_{0bg\_B}$$

$$D6 = 3R_f \omega^2 C_{0\_bgA} L_{CC\_A} L_{CC\_B} R_{0bg\_A} R_{0bg\_B}$$

$$D7 = 3R_f \omega^2 C_{0\_bgB} L_{CC\_A} L_{CC\_B} R_{0bg\_B} R_{0bg\_A}$$

$$D8 = 3R_f \omega^2 C_{0\_fd} L_{CC\_A} L_{CC\_B} R_{0bg\_B} R_{0bg\_A}$$

Figure 6:
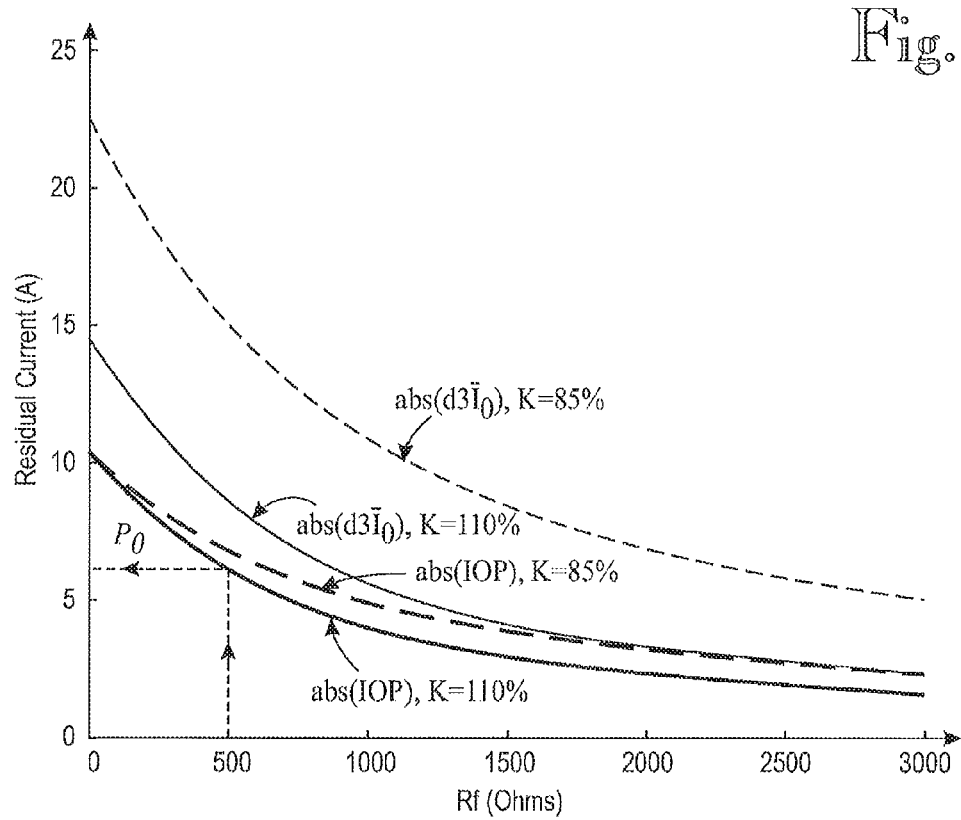
FIG. 6 shows magnitudes of residual differential current and the operate quantity of the protection as a function of fault resistance according to an exemplary embodiment of the present disclosure.

Using the data from the previous example, and eq07, eq08, eq10 and eq12, the magnitude of the residual differential current and the operate quantity, $I_{OP}$, can be calculated as a function of fault resistance, when the characteristic angle has been set to zero degrees. FIG. 6 shows the results in the undercompensated (K=85%) and overcompensated (K=110%) cases. On the basis of this example, if faults with fault resistance up to 500 Ohms must be detected, $P_0$ must be set to correspond to approximately 6 Amperes of primary operate current.

In cases where the characteristic angle setting is selected positive, such as in low-impedance or solidly earthed networks, the setting for $P_o$ must additionally be checked against the zero-sequence charging current supplied by the protected feeder in case of solid earth fault outside the zone of protection. The setting $P_0$ must then be selected according to eq13:

$$P_0 > m \cdot \text{abs}(3\bar{I}_{0fd}) \cdot \cos(90° - \phi_b) \qquad (eq13)$$

where $3\bar{I}_{0fd}$ is the residual current supplied by the protected feeder in case of outside solid fault (i.e. when $R_f$=0 Ohm)

$\phi_b$ is the selected characteristic angle setting and m is the safety margin, which may be higher than or equal to 1.2.

For the setting example above, which is valid for a compensated network, and calculated according to eq10 and eq12, the additional setting consideration of eq13 does not set any limitations for selecting $P_0$, as the characteristic angle setting could be set to zero degrees. Due to this the operate quantity, $I_{OP}$, goes very close to zero in case of outside fault independent of the magnitude of the zero-sequence charging current of the protected feeder. $S_0$ may be set as approximately 50%, for example. Also $I_{KNEE\_0}$ may be set and a suitable value may be approximately 1 (per-unit value where the base value may be the nominal current of the protected connection), for example.

Thus, according to an exemplary embodiment, a fault is detected in the electric connection between the first point and the second point if:

$$I_{OP} > P_0 \text{ when } I_{RES} \leq I_{KNEE\_0}, \text{ and}$$

$$I_{OP} > P_0 + S_0 \cdot (I_{RES} - I_{KNEE\_0}) \text{ when } I_{RES} > I_{KNEE\_0}$$

Figure 7:
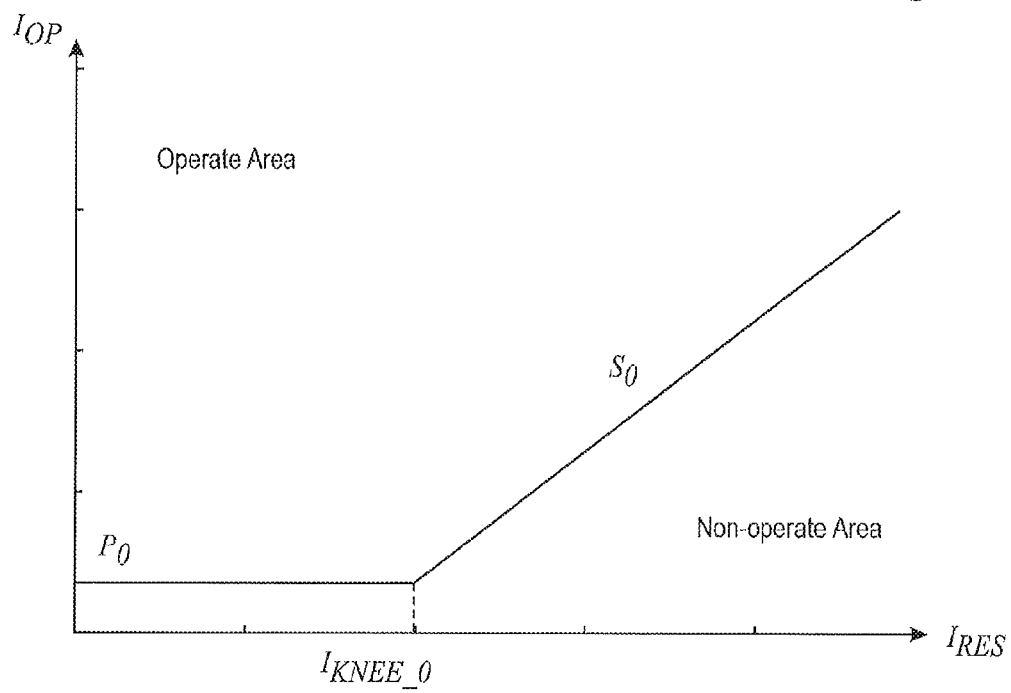
FIG. 7 shows an example of an operation characteristic according to an exemplary embodiment of the present disclosure.
Figure 8:
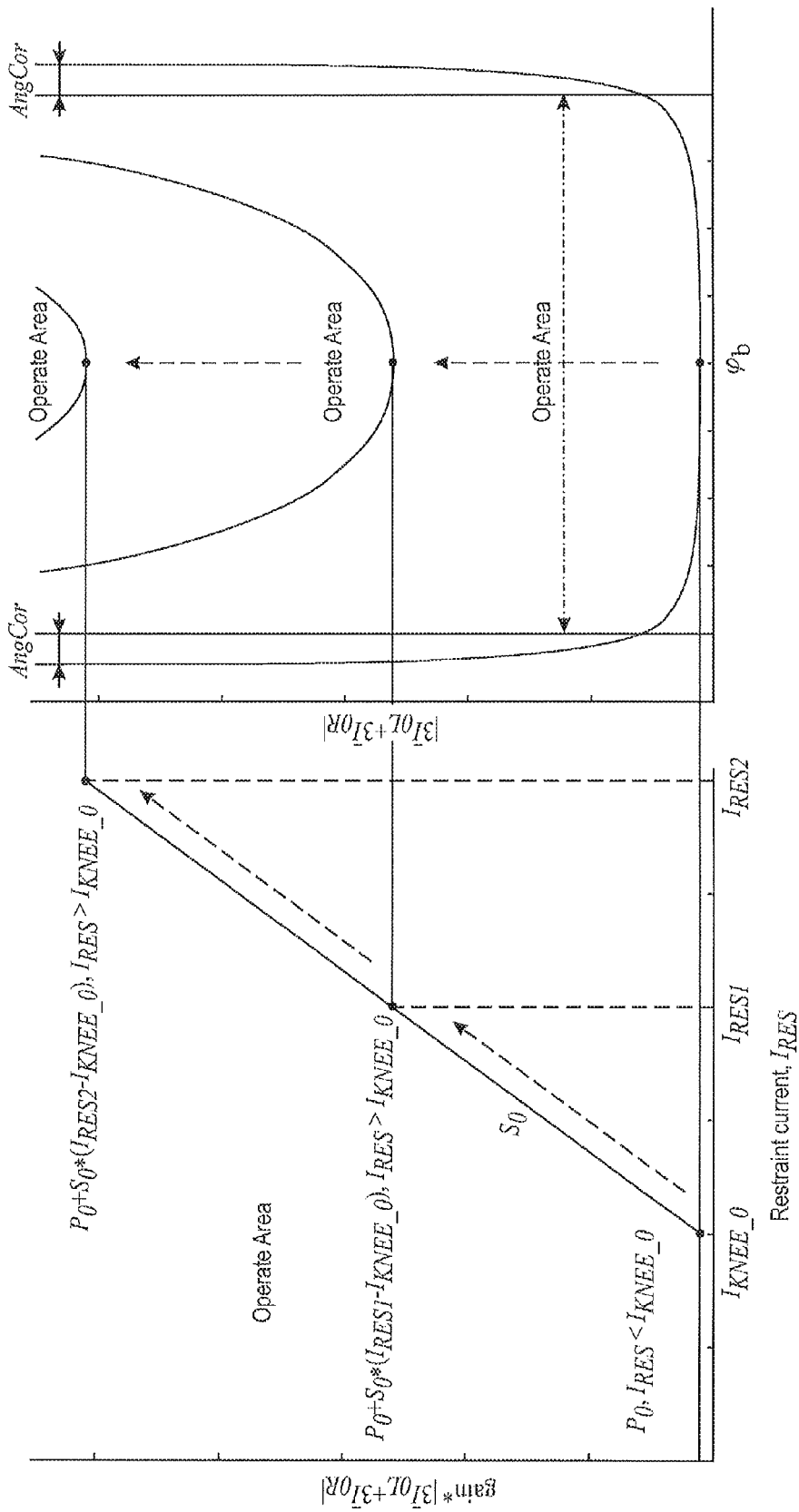
FIG. 8 shows an example of a conversion of an operation characteristic according to an exemplary embodiment of the present disclosure.

The above operating characteristic in $I_{RES}$, $I_{OP}$-plane is represented in FIG. 7, which shows the operate area and non-operate area of the directional residual differential current protection according to an exemplary embodiment. The sensitivity $P_0$ is constant up to $I_{RES} = I_{knee\_0}$. With higher restraint currents the sensitivity is affected by the slope setting $S_0$. The characteristic can also be represented in $\phi$, $|3\bar{I}_0|$-plane, as shown in FIG. 8.

Depending on the earth fault current levels and the applied operating speed requirements of the protection, the operation of the protection may need to be delayed. Therefore, timer functionality (definite time, inverse time) may be added to the scheme.

After a fault is detected, the directional residual differential current protection unit 10A, 10B may send an indication or an alarm from the output OUT of the connected transmitter-receiver unit 12A, 12B and/or directly control a circuit breaker or other switching elements of the electric system.

Like all earth fault protection schemes the above solution may be affected by a possible phase angle error related to the residual current measurement. FIG. 9 shows the formation and the effect of the phase angle errors in local and remote ends of the connection in case of outside earth fault. It should be noted that voltage and current signals are in different scale. The following notations have been used:

Local End:

$3\bar{I}_{0L}$=primary residual current of the local end reduced to the secondary side $3\bar{I}_{0L\_sec}$=secondary residual current of the local end affected by the phase angle error of the local cable CT (assumed max. 5 degrees)

$3\bar{I}_{0R}$=primary residual current of the remote end reduced to the secondary side $3\bar{I}_{0R\_sec\_received}$=secondary residual current of the remote end affected by the phase angle error of the remote cable CT and the phase angle error due to communication channel between the line ends (assumed max. 1 degree)

$3\bar{I}_{0L}+3\bar{I}_{0R}$=primary residual differential current reduced to the secondary side $3\bar{I}_{0L\_sec}+3\bar{I}_{0R\_sec\_received}$=secondary residual differential current affected by the above phase angle errors $\epsilon_L$=resulting phase angle error at the local end $\bar{U}_0$=residual voltage reference Remote End:

$3\bar{I}_{0R}$=primary residual current of the remote end reduced to the secondary side $3\bar{I}_{0R\_sec}$=secondary residual current of the remote end affected by the phase angle error of the remote cable CT (assumed max. 5 degrees)

$3\bar{I}_{0L}$=primary residual current of the local end reduced to the secondary side $3\bar{I}_{0L\_sec\_received}$=secondary residual current of the local end affected by the phase angle error of the local cable CT and the phase angle error due to communication channel between the line ends (assumed max. 1 degree)

$3\bar{I}_{0L}+3\bar{I}_{0R}$=primary residual differential current reduced to the secondary side $3\bar{I}_{0R\_sec}+3\bar{I}_{0L\_sec\_received}$=secondary residual differential current affected by the above phase angle errors $\epsilon_R$=resulting phase angle error at the remote end $\bar{U}_0$=residual voltage reference From FIG. 9 it can be seen that with similar high quality cable current transformers at both ends of the connection the resulting phase angle error in the measured residual differential current is about the same as that caused by an individual cable current transformer. Therefore, the use of similar high quality cable current transformers at both ends of the connection minimizes the phase angle error due to the measurement inaccuracy of the current transformers. In order to ensure the stability of the scheme, a settable angle correction feature may be provided. This feature limits the operation area seen in the $\phi$, $|d3\bar{I}_0|$-plane from the side which is the most prone to the instability caused by the phase angle errors. Phase angle correction may be implemented by a dedicated angle setting, by which the operate area given by eq07 and eq08 is additionally limited; see FIG. 8 for an example, where an angle correction of 10 degrees is selected (setting AngCor).

An apparatus according to any one of the above embodiments, or a combination thereof, may be implemented as one unit or as two or more separate units that are configured to implement the functionality of the various embodiments. Here the term 'unit' refers generally to a physical or logical entity, such as a physical device or a part thereof or a software routine. One or more of these units may reside in a protective relay device or equipment, for example.

An apparatus according to any one of the embodiments may be implemented by means of a computer or corresponding digital signal processing equipment executing suitable software, for example. Such a computer or digital signal processing equipment can include at least a non-transitory computer-readable recording medium (e.g., a non-volatile memory such as a ROM, hard disk drive, flash memory, etc.) for tangibly recording software and/or program instructions, a working memory (RAM) providing storage area for arithmetical operations, and a central processing unit (CPU), such as a general-purpose digital signal processor. The CPU may include a set of registers, an arithmetic logic unit, and a control unit. The control unit is controlled by a sequence of program instructions transferred to the CPU from the RAM. The control unit may contain a number of microinstructions for basic operations. The implementation of microinstructions may vary depending on the CPU design. The program instructions may be coded by a programming language, which may be a high-level programming language, such as C, Java, etc., or a low-level programming language, such as a machine language, or an assembler. The computer may also have an operating system which may provide system services to a computer program written with the program instructions. The computer or another apparatus implementing the disclosure can also include suitable input means for receiving, for example, measurement and/or control data, which input means thus enable, for example, the monitoring of current and voltage quantities, and output means for outputting, for example, fault alarms and/or control data, such as for controlling protection equipment such as switches, disconnectors and circuit-breakers. It is also possible to use a specific integrated circuit or circuits, and/or discrete components and devices for implementing the functionality according to any one of the embodiments.

The present disclosure can be implemented in existing system elements, such as various protective relays or similar devices, or by using separate dedicated elements or devices in a centralized or distributed manner. Present protective devices for electric systems, such as protective relays, can include processors and memory that can be utilized in the functions according to embodiments of the disclosure. Thus, all modifications and configurations required for implementing an embodiment of the disclosure, for example, in existing protective devices may be performed as software routines, which may be implemented as added or updated software routines. If the functionality of the disclosure is implemented by a processor executing software recorded on a non-transitory computer-readable recording medium, such software can be provided as a computer program product including a computer program code which, when run on a computer, causes the computer or a corresponding arrangement to perform the functionality according to the disclosure, as described above. Such a computer program code may be tangibly stored (recorded) or generally embodied on a computer readable medium, such as suitable memory, for example, a flash memory or a disc memory from which it is loadable to the unit or units executing the program code. In addition, such a computer program code implementing the disclosure may be loaded to and recorded by the unit or units executing the computer program code via a suitable data network, for example, and it may replace or update a possibly existing program code.

It will be obvious to a person skilled in the art that, as the technology advances, the inventive concept may be implemented in various ways. The disclosure and its embodiments are not limited to the examples described above but may vary within the scope of the claims.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. A method for differential protection of a three phase electric connection of an electric system, the method comprising:
   detecting current quantities at a first point and a second point of the three phase electric connection of the electric system;
   determining a value of an operate quantity, the operate quantity being based on a difference between the detected current quantities at the first point and the second point of the electric connection;
   determining that a fault is present in the electric connection between the first point and the second point if the value of the operate quantity exceeds a value of a predetermined threshold quantity; and
   controlling, by at least one protective relay, a switching element of the electric system to activate a fault protection when a fault in the electric connection is determined to be present,
   wherein the operate quantity $I_{OP}$ is defined by the following equation:

$$I_{OP} = |d3\bar{I}_0| \cdot \text{gain} = |3\bar{I}_{0L} + 3\bar{I}_{0R}| \cdot \text{gain},$$

where
   $d3\bar{I}_0$ = residual differential current phasor,
   $3\bar{I}_{0L}$ = residual current phasor at the first point such that a positive current flow is towards the second point,
   $3\bar{I}_{0R}$ = residual current phasor at the second point such that a positive current flow is towards the first point, and $$\text{gain} = \cos(\text{angle}(-\bar{U}_0/d3\bar{I}_0) - \phi_b),$$

where
   $\phi_b$ = characteristic angle setting, and
   $\bar{U}_0$ = residual voltage phasor of the electric connection.

2. The method of claim 1, wherein the characteristic angle setting is 0° for a compensated electric system, −30° for a high-resistance earthed electric system, and −90° for an unearthed electric system.

3. The method of claim 1, wherein the characteristic angle setting is set based on an angle between a negative residual voltage and a residual current during an earth fault in the electric connection.

4. The method of claim 1, wherein the predetermined threshold quantity is:

$$P_0 \text{ when } I_{RES} \leq I_{KNEE\_0}, \text{ and}$$

$$P_0 + S_0 \cdot (I_{RES} - I_{KNEE\_0}) \text{ when } I_{RES} > I_{KNEE\_0},$$

where $P_0, S_0, I_{KNEE\_0}$=predetermined parameters, and $$I_{RES} = \frac{\frac{|\bar{I}_{aL}|+|\bar{I}_{aR}|}{2} + \frac{|\bar{I}_{bL}|+|\bar{I}_{bR}|}{2} + \frac{|\bar{I}_{cL}|+|\bar{I}_{cR}|}{2}}{3}$$

where $\bar{I}_{aL}, \bar{I}_{bL}, \bar{I}_{cL}$=phase currents of the electric connection at the first point, and $\bar{I}_{aR}, \bar{I}_{bR}, \bar{I}_{cR}$=phase currents of the electric connection at the second point.

5. The method of claim 3, wherein
$P_0$=basic sensitivity of the protection, where
$S_0$=50%, and
$I_{KNEE\_0}$=1 p.u.

6. A non-transitory computer-readable recording medium having a computer program recorded thereon that causes a processor of a computer processing device to carry out operations for differential protection of a three phase electric connection of an electric system, the operations comprising:
   detecting current quantities at a first point and a second point of the three phase electric connection of the electric system;
   determining a value of an operate quantity, the operate quantity being based on a difference between the detected current quantities at the first point and the second point of the electric connection;
   determining that a fault is present in the electric connection between the first point and the second point if the value of the operate quantity exceeds a value of a predetermined threshold quantity; and
   controlling, by at least one protective relay, a switching element of the electric system to activate a fault protection when a fault in the electric connection is determined to be present,
   wherein the operate quantity $I_{OP}$ is defined by the following equation:

$$I_{OP}=|d3\bar{I}_0|\cdot\text{gain}=|3\bar{I}_{0L}+3\bar{I}_{0R}|\cdot\text{gain},$$

where
$d3\bar{I}_0$=residual differential current phasor,
$3\bar{I}_{0L}$=residual current phasor at the first point such that a positive current flow is towards the second point,
$3\bar{I}_{0R}$=residual current phasor at the second point such that a positive current flow is towards the first point, and $$\text{gain}=\cos(\text{angle}(-\bar{U}_0/d3\bar{I}_0)-\square\square_b),$$

where
$\phi_b$=characteristic angle setting, and
$\bar{U}_0$=residual voltage phasor of the electric connection.

7. An apparatus for differential protection of a three phase electric connection of an electric system, the apparatus comprising:
   means for detecting current quantities at a first point and a second point of the three phase electric connection of the electric system;
   means for determining a value of an operate quantity, the operate quantity being based on a difference between the detected current quantities at the first point and the second point of the electric connection; and
   means for determining that a fault is present in the electric connection between the first point and the second point if the value of the operate quantity exceeds a value of a predetermined threshold quantity; and
   means for controlling, by at least one protective relay, a switching element of the electric system to activate a fault protection when a fault in the electric connection is determined to be present,
   wherein the operate quantity $I_{OP}$ is defined by the following equation:

$$I_{OP}=|d3\bar{I}_0|\cdot\text{gain}=|3\bar{I}_{0L}+3\bar{I}_{0R}|\cdot\text{gain},$$

where
$d3\bar{I}_0$=residual differential current phasor,
$3\bar{I}_{0L}$=residual current phasor at the first point such that a positive current flow is towards the second point,
$3\bar{I}_{0R}$=residual current phasor at the second point such that a positive current flow is towards the first point, and $$\text{gain}=\cos(\text{angle}(-\bar{U}_0/d3\bar{I}_0)-\square\square_b),$$

where
$\phi_b$=characteristic angle setting, and
$\bar{U}_0$=residual voltage phasor of the electric connection.

8. The apparatus of claim 7, wherein the characteristic angle setting is 0° for a compensated electric system, −30° for a high-resistance earthed electric system, and −90° for an unearthed electric system.

9. The apparatus of claim 7, wherein the characteristic angle setting is set based on an angle between a negative residual voltage and a residual current during an earth fault in the electric connection.

10. The apparatus of claim 7, wherein the predetermined threshold quantity is:

$P_0$ when $I_{RES} \leq I_{KNEE\_0}$, and $P_0+S_0*(I_{RES}-I_{KNEE\_0})$ when $I_{RES}>I_{KNEE\_0}$, where
$P_0, S_0, I_{KNEE\_0}$=predetermined parameters $$I_{RES} = \frac{\frac{|\bar{I}_{aL}|+|\bar{I}_{aR}|}{2} + \frac{|\bar{I}_{bL}|+|\bar{I}_{bR}|}{2} + \frac{|\bar{I}_{cL}|+|\bar{I}_{cR}|}{2}}{3}$$

where
$\bar{I}_{aL}, \bar{I}_{bL}, \bar{I}_{cL}$=phase currents of the electric connection at the first point, and
$\bar{I}_{aR}, \bar{I}_{bR}, \bar{I}_{cR}$=phase currents of the electric connection at the second point.

11. The apparatus of claim 10, wherein $P_0$=basic sensitivity of the protection, where
$S_0$=50%, and
$I_{KNEE\_0}$=1 p.u.

12. The apparatus claim 7, comprising:
a protective relay.

* * * * *